United States Patent [19]

Boys

[11] Patent Number: 4,761,218
[45] Date of Patent: Aug. 2, 1988

[54] SPUTTER COATING SOURCE HAVING PLURAL TARGET RINGS

[75] Inventor: Donald R. Boys, Cupertino, Calif.

[73] Assignee: Varian Associates, Inc., Palo Alto, Calif.

[21] Appl. No.: 848,900

[22] Filed: Apr. 4, 1986

Related U.S. Application Data

[63] Continuation of Ser. No. 611,554, May 17, 1984, abandoned.

[51] Int. Cl.[4] .............................................. C23C 14/36
[52] U.S. Cl. ................................. 204/298; 204/192.2
[58] Field of Search ................. 204/192.2, 192.12, 298

[56] References Cited

U.S. PATENT DOCUMENTS

| | | | |
|---|---|---|---|
| 4,275,126 | 6/1981 | Bergmann et al. | 429/30 |
| 4,313,815 | 2/1982 | Graves, Jr. et al. | 204/298 |
| 4,385,979 | 5/1983 | Pierce et al. | 204/298 |
| 4,465,575 | 8/1984 | Love et al. | 204/192.5 |

FOREIGN PATENT DOCUMENTS 47-15202  5/1972  Japan .................... 204/298

OTHER PUBLICATIONS

J. L. Vossen et al, Thin Film Processes, Academic Press, New York, 1978, pp. 143-145.

Primary Examiner—John F. Niebling
Assistant Examiner—William T. Leader
Attorney, Agent, or Firm—Stanley Z. Cole; Leon F. Herbert; John C. Yakes

[57] ABSTRACT

A sputter coating source has separate annular targets spaced outwardly from each other around a central axis. Magnetic field generating means are provided to establish magnetic field lines over each target around an annular path. Each target has its own separate magnetic field generating means including an electromagnet having a separately controllable power supply whereby the strength of the magnetic field over each target may be separately controlled. The targets are electrically separated from each other, and each target has a separately controllable power supply whereby the plasma power for each target may be separately controlled. More than two separate targets may be employed, and the various targets may be positioned at different distances from the substrate. The targets may be made of magnetic material.

1 Claim, 3 Drawing Sheets

SPUTTER COATING SOURCE HAVING PLURAL TARGET RINGS

This application is a continuation, of application Ser No. 611,554, filed May 17, 1984, now abandoned.

TECHNICAL FIELD

This invention relates to sputter coating sources having target members from which material is sputtered for thin film deposition. More particularly, the invention relates to magnetron sputter coating sources.

BACKGROUND OF THE INVENTION AND PRIOR ART

Magnetron sputter coating sources are sources employing crossed electric and magnetic fields over the sputtering surface of the sputter target in an arrangement which traps electrons to create a plasma in a partial vacuum of a gas in a vacuum chamber. The electrons bombard the gas atoms to form positively charged gas ions. The positively charged ions are attracted by a negatively charged target to sputter off particles of the target.

In early magnetron sputter coating systems, it was customary to move the substrates in various ways during coating in order to obtain uniform coating thickness across the substrate and to obtain good step coverage. More recently apparatus has been developed for in situ coating wherein the substrate is held stationary during coating.

Also, there is a growing need for coating larger and larger substrates, and substrates of different shapes. This invention addresses means for filling these needs.

Further, it has been noted that the deposition rate changes as the target becomes eroded. A solution to this problem has been to change the power delivered to the target during sputtering operaton of target, as set forth in the commonly assigned U.S. Pat. No. 4,166,783 entitled "Deposition Rate Regulation by Computer Control of Sputtering Systems". Another power supply control system is set forth in the commonly assigned copending U.S. patent application of Donald R. Boys and Robert M. Smith, Ser. No. 06/564,776, filed Dec. 27, 1983 (U.S. Pat. No. 4,500,408) and incorporated herein by reference. Said pending application also recognizes that the strength of the magnetic field has an effect on the sputter process, and employs an electromagnet for generating the magnetic field so that the strength of such field is controllable.

OBJECT OF THE INVENTION

The object of the invention is to provide sputter coating source designs having plural erosion regions on the target means and adaptable in different embodiments to provide desired profiles of deposition thickness across different substrate shapes and sizes.

SUMMARY OF THE INVENTION

In a preferred embodiment there are a plurality of annular targets spaced outwardly from each other around a central axis. Magnetic field generating means are provided to establish magnetic field lines over each target around an annular path. Each target has its own separate magnetic field generating means including an electromagnet having a separately controllable power supply whereby the strength of the magnetic field over each target may be separately controlled. The targets are electrically separated from each other, and each target has a separately controllable power supply whereby the power for each target may be separately controlled.

DETAILED DESCRIPTION OF THE PREFERRED EMBODIMENTS

Figure 1:
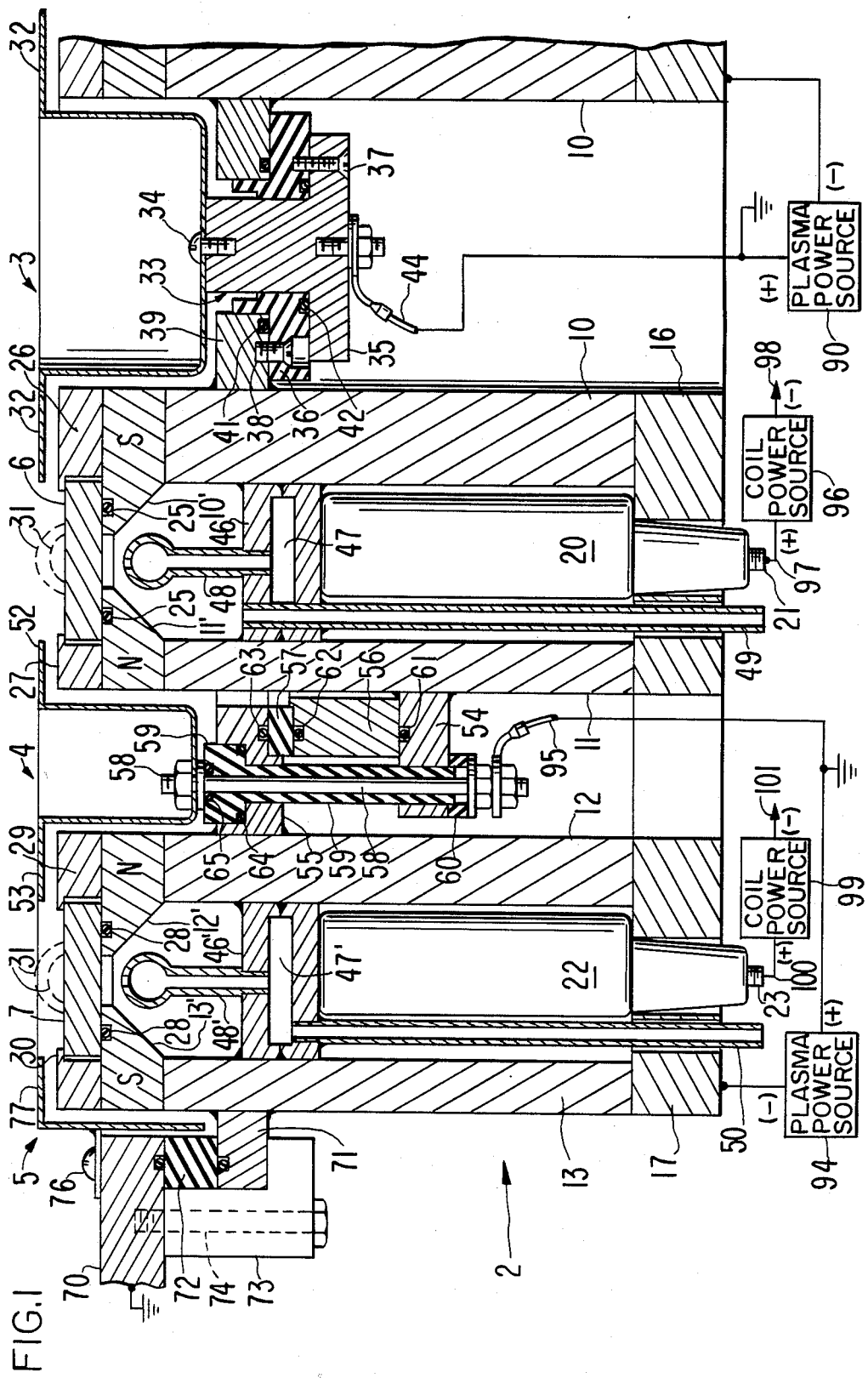
FIG. 1 is a cross-sectional view of the left half of a circular sputter source according to the invention.

The sputter coating source 2 of FIG. 1 comprises a central anode structure 3, a ring-shaped intermediate anode structure 4, and an outer ring-shaped anode structure 5. Between the respective anode structures are an inner ring-shaped target 6 and an outer ring-shaped target 7. The upper faces of the targets are the surfaces from which target material is to be sputtered. Means for forming a cathode structure for supporting the targets 6 and 7 and also for providing a magnetic field across the upper (sputter) surfaces of the targets comprises an inner cylinder 10, a first outer cylinder 11, a second outer cylinder 12 and a third outer cylinder 13. Attached to the top of each of cylinders 10-13 is a ring-shaped pole piece 10', 11', 12' and 13', respectively. Alternatively the pole pieces can be formed integrally with their respective cylinders. As noted previously, FIG. 1 shows only the left half of the sputter source. It should be understood that the right half is a mirror image of the left half.

The cylinders 10-13 and pole pieces 10'-13' are all of ferromagnetic material, such as soft iron. The magnetic circuit formed by members 10, 10' and 11, 11' is closed at the bottom by a ring-shaped baseplate 16. The magnetic circuit formed by members 12, 12', 13 and 13' is closed at the bottom by a ring-shaped member 17. Ring-shaped members 16 and 17 are also made of ferromagnetic material. The magnetic circuit for inner target 6 is energized by an inner ring-shaped electromagnet coil 20 provided with two electrical leads 21, one of which is shown in FIG. 1, the other one being displaced around the circle formed by coil 20. Similarly, the magnetic circuit for outer target 7 is energized by a ring-shaped electromagnet coil 22 provided with electrical leads 23. Target 6 (of a material to be sputtered) is held in place and sealed against separate ring-shaped gaskets 25 by means of an inner clamping ring 26 and an outer clamping ring 27 attached respectively to pole pieces 10' and 11' by means such as circularly spaced screws (not shown). In like manner, target 7 is held in place and sealed against separate ring-shaped gaskets 28 by means of an inner clamping ring 29 and an outer clamping ring 30 attached respectively to pole pieces 12' and 13' by screws (not shown). Clamping rings 26, 27, 29 and 30 are made of non-ferromagnetic material. The pole pieces 10', 11' and 12', 13' cause fringing magnetic field lines above targets 6 and 7 as shown in a schematic general sense by lines 31. Field lines 31 extend around a closed circular path over the top of each of the respective targets.

Central anode 3 is a cup-shaped member having a ring-shaped, radially extending upper rim 32 which overlaps clamp ring 26. Anode cup 3 is mounted on a nonmagnetic central post 33 by a screw 34. Post 33 has a peripheral bottom flange portion 35 which is attached to a ring-shaped member 36 by means of circularly arranged screws (one being shown at 37). Member 36 is made of electrically insulating material. Insulator 36 is attached by circularly arranged countersunk screws 38 to a nonmagnetic ring-shaped flange 39 which is welded or otherwise attached to cylinder 10. The space below post 33 is exposed to atmospheric pressure whereas the space above the post is exposed to the interior of a vacuum chamber, and the hermetic integrity of the system is provided by gaskets 41 and 42. An electrical lead 44 is attached to the bottom of post 33.

Inner target 6 is cooled by means of an annular nonmagnetic block 46 attached and sealed (as by welding) to the outer wall of cylinder 10 and the inner wall of cylinder 11. Block 46 has an annular passage 47 connected to circularly spaced or continuous annular nozzle means 48 which eject cooling fluid against the under surface of target 6. One or more outlet tubes 49 remove the cooling fluid from the space above block 46. The incoming cooling fluid is introduced into annular chamber 47 by an inlet tube (not shown) which is displaced circumferentially from tube 49. In similar manner the outer target 7 is cooled by means of an annular block 46' having an annular passage 47' connected to nozzle means 48'. In the case of block 46', one or more cooling fluid inlet tubes (one being shown at 50) deliver fluid to passage 47'. It will be understood that block 46' is also provided with one or more outlet tubes like tube 49, and that block 46 is provided with one or more inlet tubes like tube 50.

Anode 4 is a ring-shaped structure having a U-shaped cross section with radially extending lip portions 52 and 53 which overlap clamp rings 27 and 29 respectively. Supporting structure for anode 4 comprises a nonmagnetic ring-shaped flange 54 welded to the outside of cylinder 11, a nonmagnetic ring-shaped flange 55 welded to the inner wall of cylinder 12, a nonmagnetic spacer ring 56 and an electrically insulating ring 57, all held together by a plurality of circularly spaced bolts, one of which being shown at 58. Bolts 58 are electrically separated from cylinders 11 and 12 by an insulating sleeve 59 and an insulating washer 60. In order to preserve the hermetic integrity, ring-shaped gaskets are provided at 61, 62, 63, 64 and 65.

Figure 3:
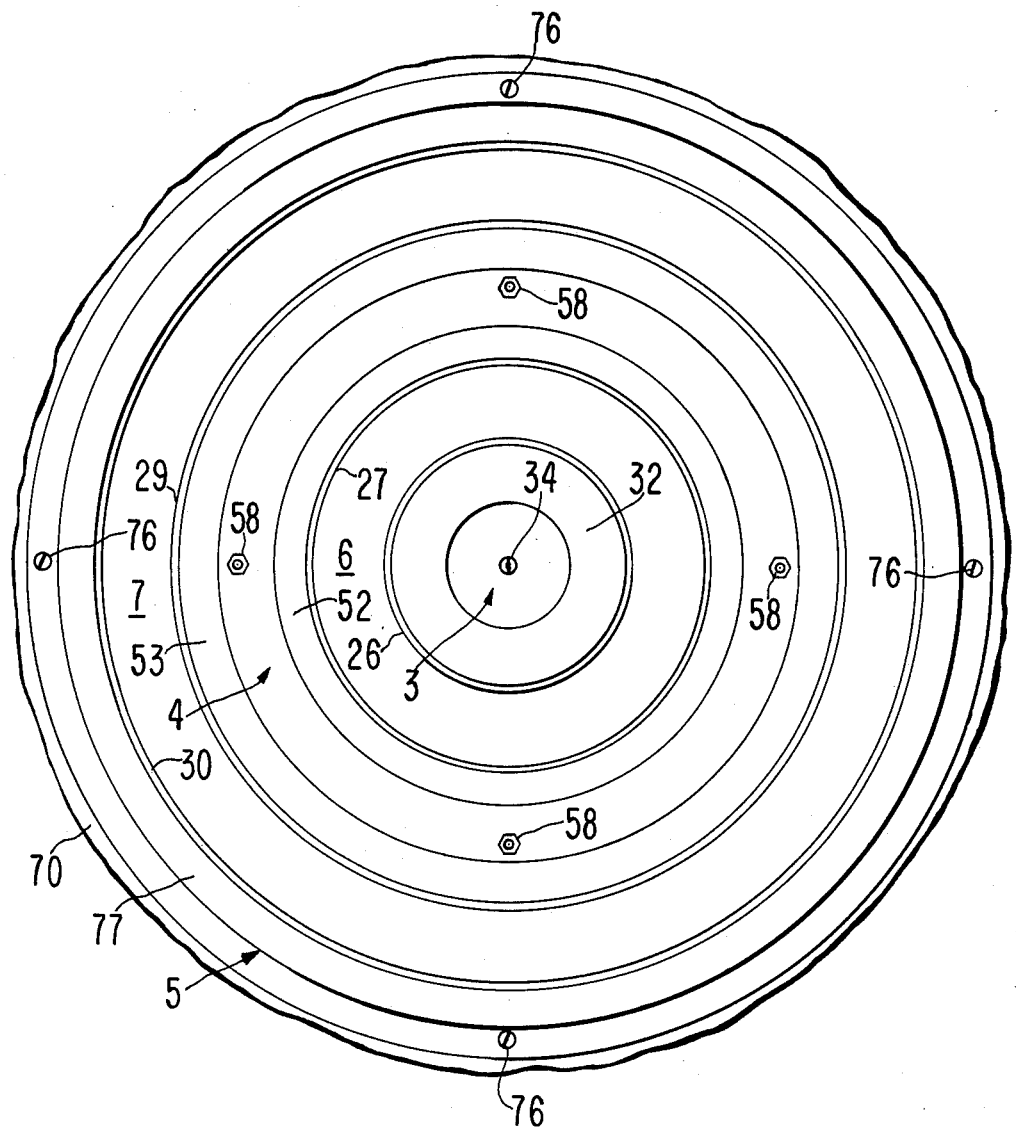
FIG. 3 is a view on reduced scale showing the entire top view of the sputter source of FIG. 1.

The source structure thus far described is adapted to be supported such that the targets 6 and 7 face toward the interior of a vacuum chamber having a wall 70 thereof provided with an aperture to receive the described sputter coating source structure. The sputter coating source structure is mounted on wall 70 by means of an annular nonmagnetic flange 71 welded to the outer wall of cylinder 13, an electrically insulating ring-shaped member 72 and a plurality of electrically insulating circularly spaced clamps, one being shown at 73 attached to wall 70 by screw 74. The outer anode 5 is mounted on the inner surface of chamber wall 70 by a plurality of circularly arranged screws 76 (see FIGS. 1 and 3) 76. Anode 5 includes a circular rim portion 77 which overlaps the clamp ring 30. It should be noted that the location and construction of anodes 3, 4 and 5 is such that the anodes form shields over clamp rings 26, 27, 29 and 30 to prevent sputtering from the clamp rings.

The sputter coating apparatus shown in FIG. 1 is specifically designed for coating an annular substrate such as a magnetic disk substrate which is to be coated with magnetic materials. Such a substrate 80 is shown in cross section in FIG. 2 and has a circular solid outer portion 81 to be coated and a central aperture 82. Substrate 80 is held stationary during sputtering by support means 85 at a position spaced from targets 6 and 7 and oriented normal to the central axis of the sputter coating source. Support means 85 can be in the form of a ring 86 which supports a plurality of deformable spring clips spaced around the periphery of disk 80, one such clip being shown at 87. It should be understood that when the substrate is to be coated with magnetic material, the targets 6 and 7 are made of the desired magnetic material.

An important aspect of the invention is that each target is electrically insulated from each other target so that the power to the plasma for each target can be separately controlled. Referring specifically to FIG. 1, a controllable plasma power source 90 is connected to target 6 via the ferromagnetic circuit for target 6 and is also connected to the lead 44 for anode 3. A second, separately controllable plasma power source 94 is connected to target 7 via the ferromagnetic circuit for target 7 and is also connected to a lead 95 for anode 4. The power sources 90 and 94 operate the targets at negative potential with respect to the anodes. Preferably the chamber wall 70 and the anodes are all at ground potential. Since the targets are insulated from each other and separately driven by independently controllable power sources, power to the plasma for each of the targets can be controlled. An increase or decrease in plasma power causes a respective increase or decrease in the sputtering rate from the target under the respective plasma. Such control makes it possible to obtain equal deposition rates for the targets or a different deposition rate from one target than for another target, both for initial sputtering and throughout erosion of the targets.

It is also important that for further control each target have a separately controllable magnetic circuit. Referring again to FIG. 1, a controllable power source 96 is connected by line 97 to one lead 21 of the inner electromagnet coil 20 and by line 98 to the circumferentially displaced other lead 21 (not shown) for the coil 20. A second controllable power source 99 is similarly connected by lines 100 and 101 to the leads 23 (only one shown) for the outer electromagnet coil 22. Since the coils 20 and 22 are separately driven by independently controllable power sources the magnetic fields over the targets can be controlled to be equal or different from each other, both for initial sputtering and throughout erosion of the targets. An increase in the strength of the magnetic field will in general tend to narrow the erosion portion of the target surface where sputtering occurs. Similarly, reducing the strength of the magnetic field will in general tend to widen the erosion portion of the target. Such changes in the erosion width will affect the profile of thickness of material deposited on a given portion of a substrate by each of the respective targets. Such independent controllability for the respective magnetic fields provides a further selective control parameter affecting sputtering, in addition to the control provided by the separate plasma power sources 90 and 94.

Figure 2:
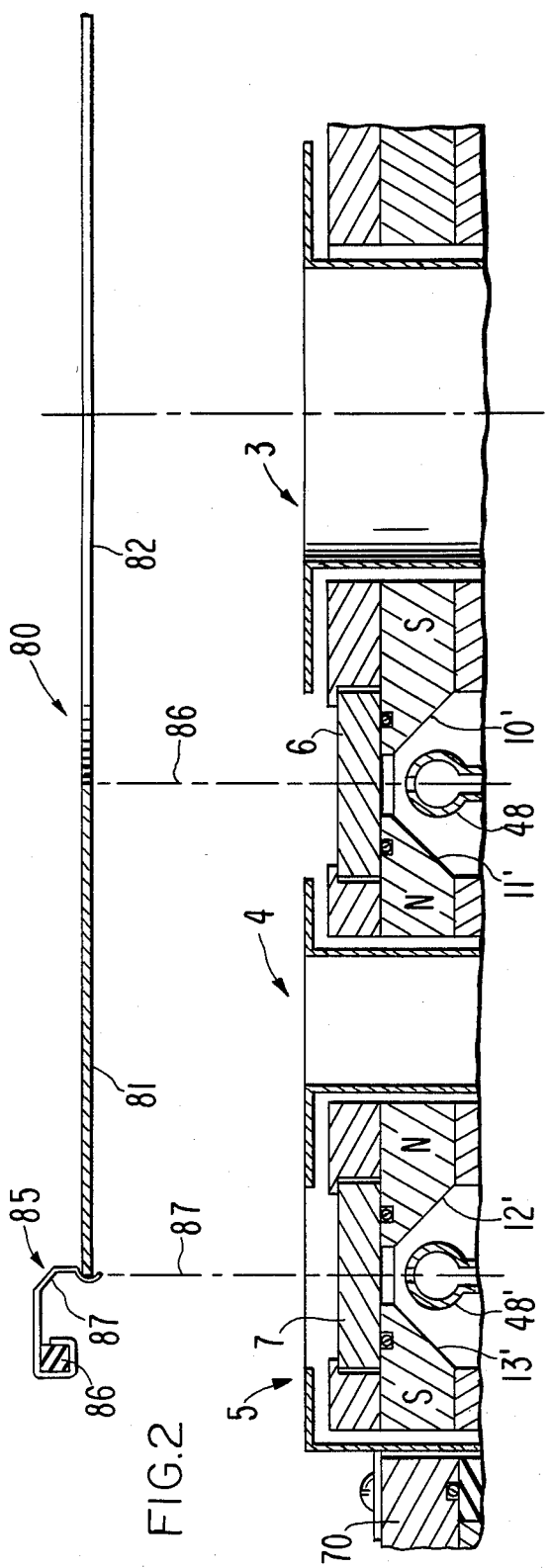
FIG. 2 shows the upper portion of FIG. 1 and its relation to the left half of an annular magnetic disk substrate in stationary position for coating by the source.

It is well known by those skilled in the art that sputtering from targets such as targets 6 and 7 takes place in an erosion region under the magnetic field lines 31, and that the deposition of sputtered material is greatest in-line with the center of the erosion region and diminishes outwardly on both sides of such center. Referring to FIG. 2, it will thus be understood that deposition on the solid portion 81 of disc 80 will be a combination of deposition from target 6 and deposition from target 7. Deposition on the right side of portion 81 will be primarily from target 6, and deposition on the left side of portion 81 will be primarily from target 7. At an area adjacent the center of portion 81, the deposition will be approximately the same from both targets, assuming the deposition rate is the same from both targets. Thus, the actual deposition thickness across the width of portion 81 will be a combination of deposition from target 6 and from target 7.

Since power for the magnetic fields and plasmas of target 6 and 7 are independently controlled, a great degree of flexibility is provided in the sense of being able to control the sputtering from one target in respect to the other for the purpose of optimizing a coating which is substantially uniform across the solid substrate portion 81 or obtaining some desired degree of non-uniformity. Also, the fact that each of the targets has its own two independent magnet systems, makes it a relatively simple matter to position one of the targets at a higher or lower elevation with respect to the other. The particular thickness profile to be obtained across substrate portion 81 in any given situation is a function of the spacing between targets 6 and 7, the width of the erosion region on each of the targets, the elevations (if any) of the targets, the spacing between the targets and the substrate, and the control of the respective power sources 90, 94, 96 and 99. A composition of these various parameters for best optimization of a particular desired coating profile can be obtained by experimentation and/or by computer calculation based on the well-known trajectory pattern of sputtered particles, and the dispersion probabilities for a given pressure of gas in the chamber. Also, it should be understood that one or more additional annular targets with their separate magnetic and plasma power sources could be positioned radially outward of target 7 to accommodate disc substrates having solid annular portions substantially wider than the solid portion 81 of disc 80.

Figure 4:
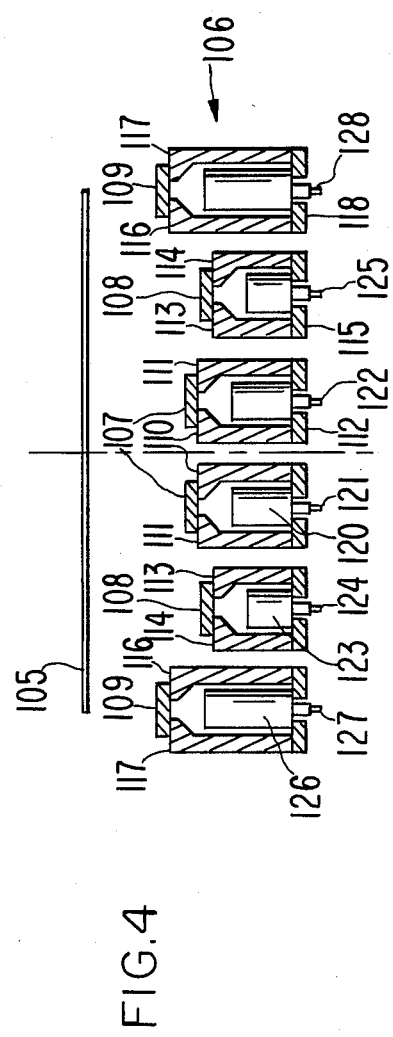
FIG. 4 is a schematic cross-section representation of another embodiment of the invention.

FIG. 4 shows a schematic cross-sectional view of another embodiment of the invention, particularly adapted for coating solid substrates such as a circular semiconductor wafer 105. The sputter coating source 106 of FIG. 4 comprises a central ring-shaped target 107, an intermediate ring-shaped target 108, and an outer ring-shaped target 109. Target 107 is mounted on an inner cylinder 110 and a surrounding cylinder 111, both mounted on a ring-shaped base plate 112. Target 108 is mounted on cylinders 113 and 114, both mounted on a ring-shaped base plate 115. Target 109 is mounted on cylinders 116 and 117, both mounted on a ring-shaped base plate 118. As in the case of FIG. 1, all of the cylinders and base plates are made of ferromagnetic material. Cylinders 110 and 111 for target 107 are magnetically energized by a ring-shaped electromagnet coil 120, having leads 121 and 122 for connection to a coil power source. The cylinders 113 and 114 for target 108 are magnetically energized by an electromagnet coil 123, having leads 124 and 125 for connection to a coil power source. Cylinders 116 and 117 for target 109 are magnetically energized by an electromagnet coil 126, having leads 127 and 128 for connection to a coil power source. Obviously cooling means and anode shields could be incorporated in FIG. 4 in similar manner as described for FIG. 1. Also as in FIG. 1, it should be understood that targets 107, 108 and 109 in FIG. 4 are electrically separate from each other, and that a separately controllable coil power source and a separately controllable plasma power source can be provided for each of the targets. In particular, FIG. 4 shows the versatility of the invention in the sense of possible differing relative elevations of the targets (target 108 being lower than target 107, and target 109 being higher than target 107. Such differing elevations provide an additional control of the deposition pattern on a substrate because such pattern is a function of spacing between target and substrate.

Although the plasma power sources and coil power sources have been indicated as being d.c. sources, either or both of them could be alternating current sources, preferably a.c. for the coil sources and r.f. for the plasma sources. Also, it should be understood that the teachings in the aforesaid application of Boys and Smith for controlling plasma and coil power sources are applicable for use in controlling the independent sources employed in this invention.

It should be noted that in order to achieve maximum separation and individuality of the several plasma regions, the pole for one target which is adjacent the pole for an adjacent target should be of the same polarity. For example in FIG. 1, the poles formed at pole pieces 11' and 12' should have the same polarity, as indicated by the letters N and S.

Although the substrates, magnetic poles and target sputter surfaces are all described herein as being circular, it should be understood that other shapes could be employed, such as rectangular or oval shapes. Also, it should be understood that the central anode 3 in FIG. 1 could be omitted and target 6 could be a solid disc instead of being ring-shaped. This arrangement would still retain the separate plasma and separate coil power sources for the two targets. Further, in some situations it may be sufficient to individually control only the magnetic fields over the individual erosion regions on the target surfaces. In such situations, the separate ring-shaped targets could be made as a single disc-shaped target employing only an outer anode. In such arrangement the individually spaced erosion regions would still be positioned under the magnetic fields between the respective magnetic poles, and such fields would be individually controllable. However, such an arrangement would lose the powerful additional control feature of being able to individually control the power to each of the separate plasmas. Another variation would be to employ the separate targets and separately controllable plasma power sources, but omit the separate control of the magnetic fields, for example, by using permanent magnets, but again, with loss of one important degree of control.

While there have been described and illustrated several specific embodiments of the invention, it will be clear that variations in the details of the embodiments specifically illustrated and described may be made without departing from the true spirit and scope of the invention as defined in the appended claims.

What is claimed is:

1. A circular magnetron sputter coating source comprising:
   a plurality of electrically isolated cathode means disposed concentrically about the axial center line of said source, each cathode means including a magnetic sputter target made from the magnetic material to be deposited, means for mounting said magnetic sputter target and a magnetic field means including an electromagnet coil, an inner cylinder, an outer cylinder and a ring-shaped baseplate connecting the bottoms of the inner and outer cylinders, and a pair of ring-shaped pole pieces separated by an annular spatial gap and joined to the tops of the inner and outer cylinders, respectively, said cylinders, baseplate and pole pieces being made of ferromagnetic material, said magnetic sputter target being mounted so as to be positioned atop said pole pieces concentric with and normal to said source centerline, said gap and magnetic sputter target being configured and positioned so that the target completely bridges said annular spatial gap, whereby a continuous magnetic path between said pole pieces is provided through said target, an electric current flowing in said electromagnet coil causing magnetic field lines to be established in said yoke, pole pieces and magnetic sputter target;

at least one annular anode attached to said source and disposed between at least one adjacent pair of said plurality of concentrically disposed and electrically isolated cathode means;

electromagnet power source means connected to said plurality of cathode means for inedpendently controlling the current in each said electromagnet coil; and plasma power source means connected to each said sputter target on said plurality of cathode means for independently controlling the negative potential thereof with respect to said at least one anode, whereby a plurality of concentric, independently controllable toroidal plasma regions above said sputter targets are provided for the controlled sputter deposition of magnetic materials.

* * * * *